US008710833B2

(12) United States Patent
Bares

(10) Patent No.: US 8,710,833 B2
(45) Date of Patent: Apr. 29, 2014

(54) CONTACTLESS ELECTRICAL CONNECTOR FOR AN INDUCTION SENSOR, AND SENSOR INCLUDING SUCH A CONNECTOR

(75) Inventor: Jean Paul Yvon Bares, Maincy (FR)

(73) Assignee: SNECMA, Paris (FR)

( * ) Notice: Subject to any disclaimer, the term of this patent is extended or adjusted under 35 U.S.C. 154(b) by 219 days.

(21) Appl. No.: 13/256,723

(22) PCT Filed: Mar. 16, 2010

(86) PCT No.: PCT/EP2010/053333
§ 371 (c)(1),
(2), (4) Date: Nov. 23, 2011

(87) PCT Pub. No.: WO2010/106041
PCT Pub. Date: Sep. 23, 2010

(65) Prior Publication Data

US 2012/0062214 A1 Mar. 15, 2012

(30) Foreign Application Priority Data

Mar. 17, 2009 (FR) ..................................... 09 51702

(51) Int. Cl.
*G01R 33/12* (2006.01)

(52) U.S. Cl.
USPC .......................................... 324/228; 324/173

(58) Field of Classification Search
USPC ........................................................ 324/228
See application file for complete search history.

(56) References Cited

U.S. PATENT DOCUMENTS

| | | | |
|---|---|---|---|
| 6,075,433 | A | 6/2000 | Ono et al. |
| 2002/0102884 | A1 | 8/2002 | Pechstein et al. |
| 2007/0090961 | A1 | 4/2007 | Gerez |

OTHER PUBLICATIONS

International Search Report Issued Jun. 22, 2010 in PCT/EP10/053333 filed Mar. 16, 2010.

*Primary Examiner* — Reena Aurora
(74) *Attorney, Agent, or Firm* — Oblon, Spivak, McClelland, Maier & Neustadt, L.L.P.

(57) ABSTRACT

An electrical connector between an induction sensor and a cable for transmitting a signal provided by the sensor, including a current transformer with a primary coil and a mechanism for electrically coupling to the sensor, and a secondary coil with a mechanism for electrically coupling to the cable, the primary and secondary coils being attached together by a removable attachment mechanism.

13 Claims, 4 Drawing Sheets

CONTACTLESS ELECTRICAL CONNECTOR FOR AN INDUCTION SENSOR, AND SENSOR INCLUDING SUCH A CONNECTOR

The present invention relates to the field of induction sensors, notably with variable reluctance. Its subject is more particularly the electrical connector of a speed sensor mounted on a gas turbine engine, notably intended for the propulsion of aircraft.

A proximity sensor of this type consists mainly of a coil incorporated into a pole piece subjected to the magnetic field of a magnet. For a speed sensor, a gear wheel made of magnetic material is placed facing the pole shoe and is attached to the engine shaft the rotation speed of which it is desired to measure. The gap between the wheel and the head of the sensor playing the role of an air gap determines the reluctance of the magnetic circuit and consequently the flux passing through the pole piece. The rotation of the gear wheel generates a variation of this air gap and hence of the magnetic flux passing through the pole shoe and by induction in the coil an AC voltage the frequency of which is proportional to the rotation speed. The detector-gear wheel assembly therefore behaves like an auto generator.

This type of sensor is well suited for use in the aviation field. Specifically on airplanes, the electromagnetic portion of the sensor is at a distance from the electronic processing device, the two being connected by connecting wires forming with their shielding an electrical harness.

The variable-reluctance principle is relatively well suited to this type of application because it is relatively insensitive to the lengths of the connecting wires.

In practice, the output from the coil is provided by two wires that can be connected to a cable but more commonly to a connector making it possible to separate the sensor from the electrical harness in order to make it easier to install/remove.

An example of a double or triple sensor for being mounted on a turbine engine is shown in FIG. 1. Two sensors 10, 10', that can be seen in the figure, each comprise, inside a sheath, a pole 12, 12', a coil 13, 13', and a magnet 14, 14'. Cables 15, 15' transmit the electrical signal produced by the sensor to the outside wiring by means of a connection system. This connection system comprises, for each of the sensors: a sealed socket 16, 16' screwed or welded to the body of the sensor 10, 10', a movable plug 17, 17' supporting movable contacts, a rear body shell 18, 18' that can support an orientable elbow 19, 19', the elbow providing the connection with the shielding of the harness. It is therefore necessary to provide four mechanical connections in order to ensure the continuity of electrical ground and of HF shielding.

This assembly has several drawbacks. It is:

- complex, bulky and heavy,
- fragile because of the many contacts and threads,
- the source of interference of the power line disturbance type, of metallization or insulation defects resulting from pollution at the interfaces or from thermal or vibrational stresses.

Repairing and replacing a speed sensor for example on a turbojet are awkward operations.

The applicant has set itself the objective of improving the electrical connection between the sensor or the set of sensors and the wiring connecting it to the data processing devices. The objective is more particularly to produce a connection means or electrical connector that does not have the drawbacks specified above.

According to the invention, the electrical connector between an induction sensor and an electrical cable for transmitting the signal supplied by the sensor, is characterized in that it comprises a current transformer with a primary coil and a means for electrical connection to the sensor and a secondary coil with a means for connecting to said cable, the two coils being attached to one another by a removable attachment means.

By virtue of the invention, it is sufficient to separate the two coils by detaching the removable attachment means in order to disconnect the sensor from the cable.

Preferably, the primary coil is secured to a board for mounting on said sensor.

According to a first embodiment, the primary coil and the secondary coil are placed concentrically relative to one another.

More particularly, the secondary coil is resting, in an abutment-like manner against a collar of the board. Notably the board is secured to a stem forming a core, and the two coils are held together by means of a washer that is bolted onto the stem of the core and forming said removable attachment means.

According to another embodiment, the primary coil and the secondary coil are placed on one and the same spindle and are superposed.

More particularly in this embodiment, the board is secured to a stem forming a core whereof the extension forms a centering spindle for the secondary coil. Notably the secondary coil is retained by bolting onto the stem thus forming said removable attachment means.

The invention also relates to an induction sensor whereof the means for connection to a signal-transmission wiring is formed of a connector according to the invention.

The invention also relates to an assembly formed of at least two induction sensors, said electrical connectors being concentric and stacked on one and the same spindle.

The invention also relates to a device for measuring an operating parameter of an engine, such as the rotation speed, comprising at least two induction sensors connected to an electrical harness by electrical connectors according to the invention.

The electrical connector of the invention is described below in greater detail with reference to the drawings in which.

Figure 2:
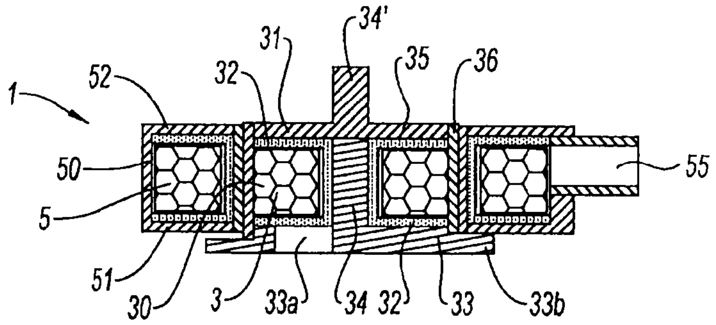
FIG. 2 represents one embodiment of an electrical connector according to the invention by transformer, whereof the removable coils are placed concentrically relative to one another.
Figure 3:
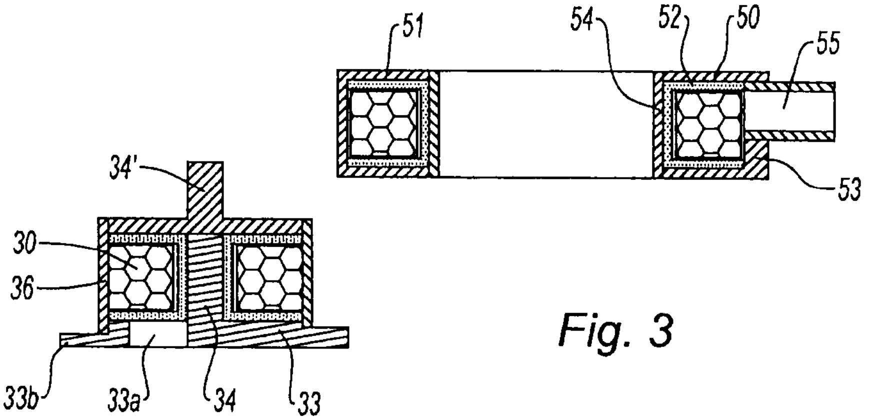
FIG. 3 represents the connection of FIG. 2 whereof the coils have been separated from one another.

With reference to FIGS. 2 and 3, it can be seen that the transformer 1 of the invention comprises a first coil forming the primary circuit 3 of the transformer and a second coil forming the secondary circuit 5. The two coils are in the same plane: the primary circuit inside the secondary circuit.

The coil 30 of the primary circuit 3 is mounted in an annular casing 31, and a magnetic half-shell 32 with a U-shaped section open radially to the outside of the coil, forming a shielding. The assembly is supported by a board 33 around a stem forming a cylindrical central core 34 perpendicular to the board 33. A plate 35 parallel to the board 33 is secured to the central core 34 and holds the coil 30 on the receptacle formed by the board 33 with the central core 34. This receptacle is for example made of stainless steel. The board 33 comprises a means for attachment to a sensor, such as a speed sensor. The attachment means is not shown. The sensor, also not shown, in this instance extends downward in a direction perpendicular to the plane of the board 33. An opening 33*a* is arranged in the board for the wires, not shown, of the sensor to pass through, via which wires the signal is transmitted to the coil 30. The opening 33*a* forming a means of electrical connection to the sensor constitutes the input of the primary circuit 3. A cylindrical thin screen 36 envelopes the coil.

The coil 50 of the secondary circuit 5 of the transformer 1 is placed concentrically outside the primary circuit. This coil 50 is housed with its casing 51 and a magnetic shielding half-shell 52 in an annular receptacle 53 with a section in the form of a U closed on the side of the primary coil 30 by a cylindrical screen 54. The annular receptacle 53 butts onto a collar 33*b* of the board 33. An air gap is arranged between the two screens 36 and 54. An opening 55 is arranged in the receptacle 53 by which the coil is in electrical contact with the outside wiring. The opening 55 forms the means for connection to the cable connected to the device for processing the signal produced by the sensor. The two elements, primary coil and secondary coil, are held together by means of a washer 37, see FIG. 5, which is slid over the extension 34' of the stem 34 and which is bolted on. This forms a removable means of attachment between the two coils.

In situ, on the engine on which the sensor, for example a speed sensor, is mounted, the electrical connection between the sensor and the device for processing the data supplied by the sensor is provided by the transformer. The AC signal supplied by the sensor via the wires passing into the opening 33*a* induces a magnetic field by travelling through the primary coil and the magnetic field thus created induces an electrical current in the secondary coil 50. This current supplies the data processing device that is connected to the secondary coil 50 of the transformer by the wiring which emerges in the opening 55. The various wirings are assembled mechanically into an electrical harness and attached to the engine by their own specific means.

By securing the elements of the primary circuit to the sensor and by attaching the elements of the secondary circuit to the electrical wiring on the engine housing, operations are simplified when work is done on the sensor. The sensor is attached by mechanical means not shown to the engine housing. When the sensor is removed, it is sufficient to detach the removable attachment means and separate the element forming the primary circuit from the element forming the secondary circuit by a movement along the spindle of the core. No electrical contact needs to be removed.

FIG. 3 shows the transformer after it has been disassembled. The element forming the primary circuit can be moved with the sensor while the element forming the secondary circuit can remain secured to the harness of electrical cables mounted on the engine housing.

Figure 1:
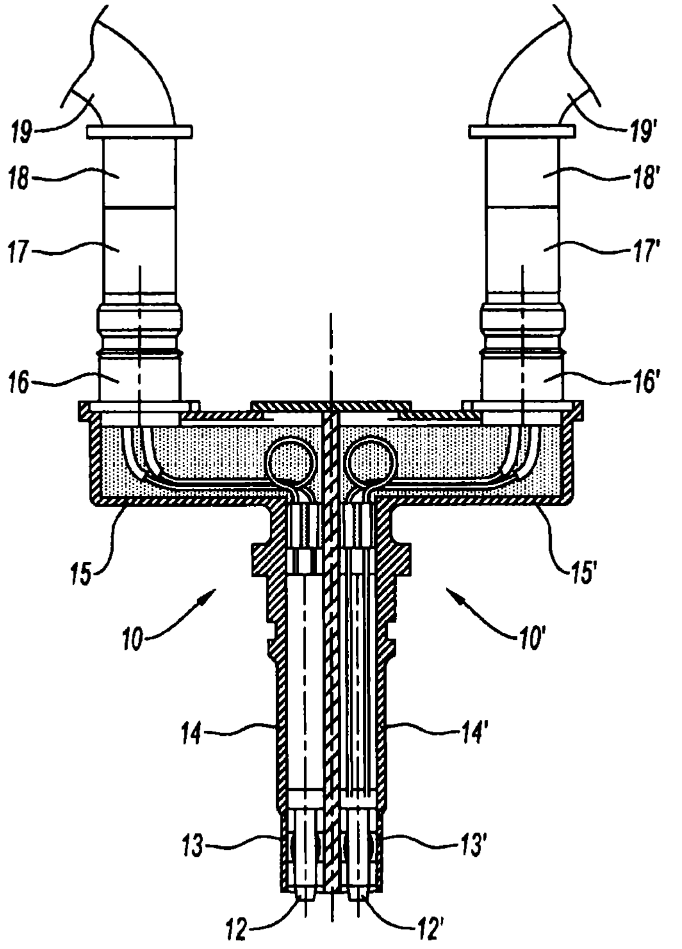
Fig. 1 PRIOR ART
FIG. 1 represents an assembly formed of a speed sensor and of its electrical connection means according to the prior art.
Figure 5:
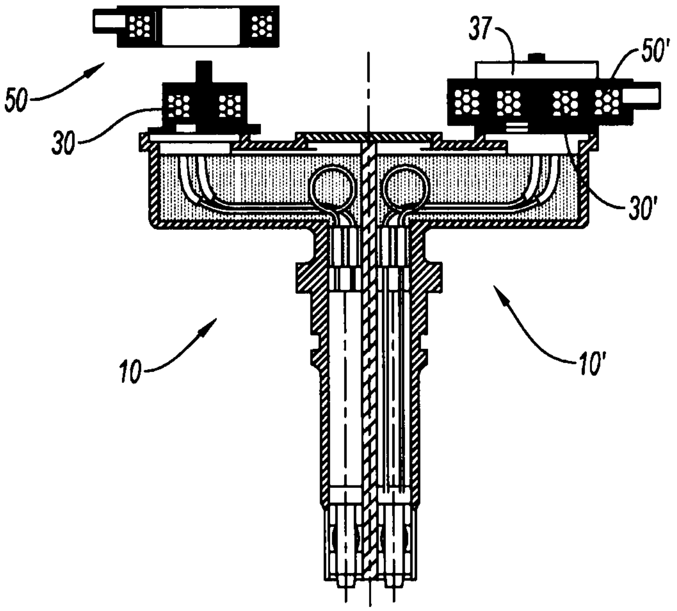
FIG. 5 represents an example of mounting the transformer with concentric coils onto speed sensors.

FIG. 5 shows an example of mounting of the connectors on a set of two sensors such as those of FIG. 1. A connector 1 is removed, its primary coil 30 remaining secured to the sensor 10 and its secondary coil 50 being separated. Another connector 1' is shown mounted on another sensor 10', the two coils 30' and 50' being held together by means of a washer 36 retained by a nut or other element on the extension 34' of the stem of the central core 34.

The means for attaching the sensors to the housing of the machine are not shown in the figures. It is for those skilled in the art to design a mounting method depending on the environment in which the sensor is to operate.

Figure 7:
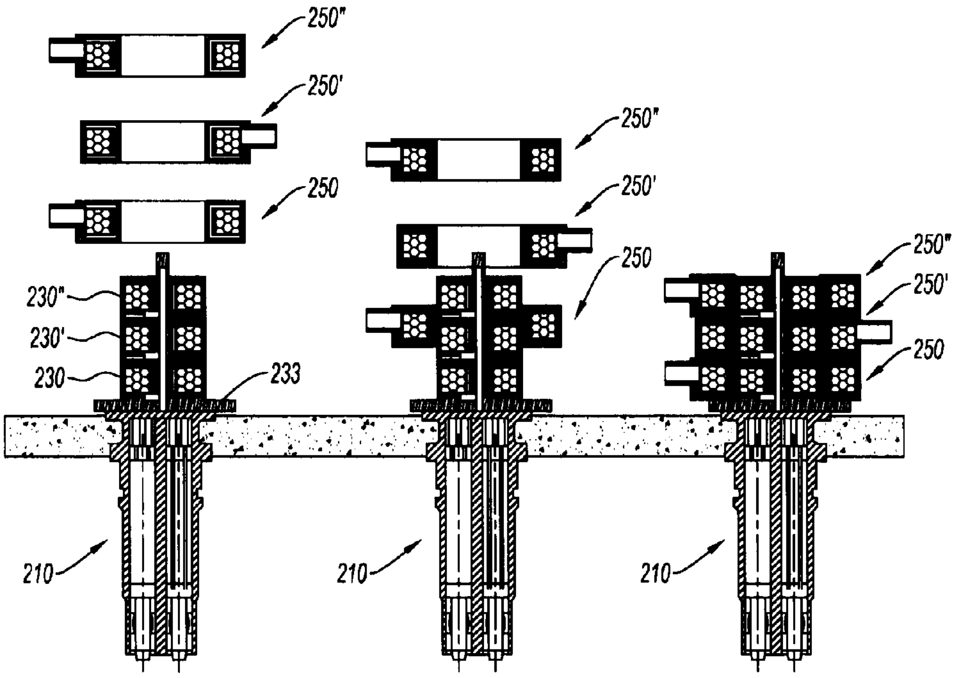
FIG. 7 represents the steps for mounting a set of three transformers with concentric coils, stacked on one and the same spindle.

A concentric arrangement as in this instance also has the advantage, in the case of an assembly formed of several sensors combined on one and the same site, of making it possible to produce a stack of several transformers in order to save space. An example of an application is shown in FIG. 7 which shows three stages in the mounting of a set of three transformers superposed on one and the same spindle. This arrangement entails a simplification of the geometry of the sensors and also greatly reduces the space requirement while preserving the independence of the three electrical harnesses.

An assembly 210 of three sensors of which only two can be seen in FIG. 7, the third being behind the first two with respect to the view shown, is attached to a board 233. This board supports a stack of three transformers, 200, 200' and 200", each forming the electrical connector of one sensor.

The three transformers each comprise a primary coil, 230, 230' and 230" respectively, and a secondary coil, 250, 250' and 250" respectively, with their respective means for connection to the sensors and to the cables.

The three primary coils are placed on a common stem secured to the board 233. The three secondary coils connected to their respective electrical harness are slid in turn onto the three primary coils so that the coils of each sensor are in correspondence. The bottom secondary coil rests on the board and the others on the coil situated underneath. The secondary coils are held in place by means of a plate which covers the top coil with a nut or other means that is screwed onto the portion of the stem that protrudes beyond the stack.

This mounting is particularly simple for the technician responsible for the maintenance operations to carry out once the identification between the coils and the sensors has been carried out.

Figure 4:
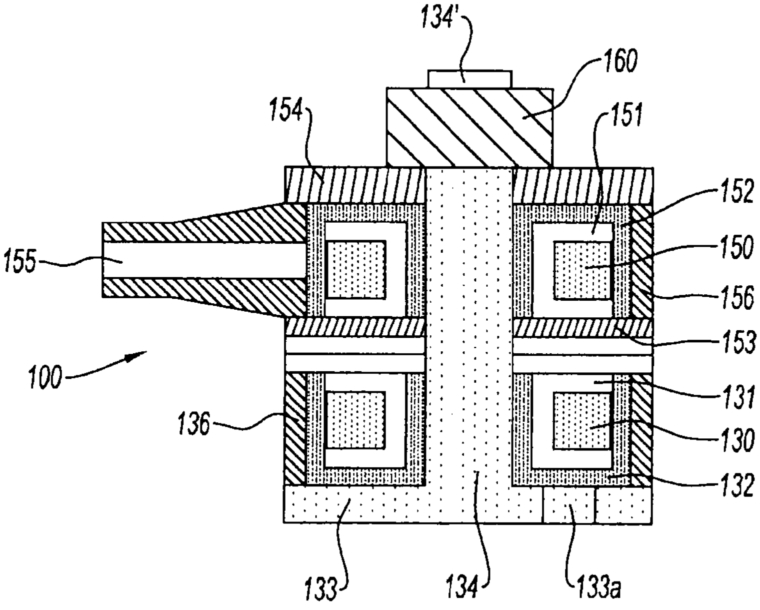
FIG. 4 represents another embodiment of an electrical connector according to the invention by transformer whereof the removable coils are superposed.

FIG. 4 shows a second embodiment of the invention in which the transformer 100 is formed of two coaxial coils. The components that are similar to those of the preceding embodiment bear the same reference number plus 100.

The primary coil 130 is mounted in an annular casing 131 and a magnetic half-shell 132 with a U-shaped section that is open laterally and forms the shielding. The assembly is supported by a board 133 around a stem forming a cylindrical central core 134, perpendicular to the board 133. A plate 135 parallel to the board 133 is secured to the central core 134. A cylindrical screen 136 envelopes the coil 130. An opening 133*a* in the board 133 makes it possible to connect the coil 130 to the wires of the sensor. The latter, not shown, extends perpendicularly to the plane of the board 133.

The secondary circuit is placed in the extension of the core 134. The coil 150 of the secondary circuit has the same diameter as the coil 130 and its spindle is aligned with that of the latter. The secondary coil 150 is contained in a casing 151 and a magnetic shielding half-shell 152. The secondary coil is held on the core 134 between two parallel plates 153, 154 forming a casing with a cylindrical cover 156.

This figure shows an element 155 for connecting the secondary coil to a wiring to a data processing device. A nut 160 at the end of the central core 134 holds the two assembled coils and forms a removable means of attachment between the two coils.

As in the previous embodiment, the primary coil is secured to the sensor while the secondary coil is attached to the electrical cable of the harness mounted on the engine housing.

In order to remove the assembly, it is sufficient to unscrew the nut 160 and to extract the primary coil 130 secured to the sensor from the secondary coil 150 that is connected to the cable harness mounted on the engine housing.

Figure 6:
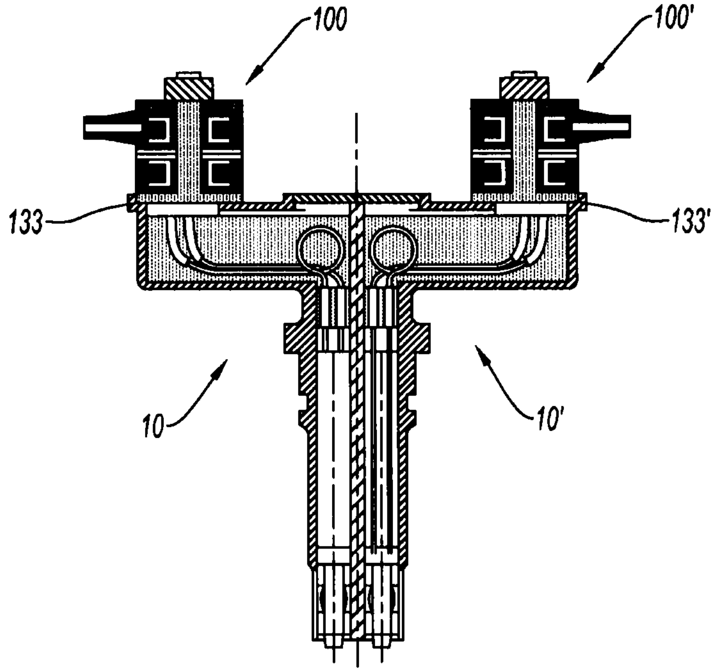
FIG. 6 represents an example of mounting by transformer with superposed coils onto speed sensors.

FIG. 6 shows the two sensors 10 and 10' fitted with two connectors 100 and 100' according to the second embodiment. The two connectors are attached by their board 133, 133' to their respective sensor.

In one or the other of the embodiments, the ratio between the number of turns of the primary coil and the turns of the secondary coil may be chosen to equal one, but it may be chosen so as to have a step-up in voltage between the primary circuit and the secondary circuit.

Overall, the solution of the invention allows a saving in space and in weight. This signal-transmission method is possible for an extensive range of temperatures, temperatures higher than 260° C. can be envisaged. Reliability relative to connections by contact is increased and the electromagnetic technology used is tried and tested because it originates from that of the sensors.

The invention claimed is:

1. An electrical connector between an induction sensor and an electrical cable for transmitting a signal supplied by the sensor, comprising:

a current transformer including a primary coil and means for electrical connection to the sensor and a secondary coil including means for connecting to the cable, the primary and secondary coils being attached to one another by a removable attachment means.

2. The connector as claimed in claim 1, wherein the primary coil is secured to a board for mounting on the sensor.

3. The connector as claimed in claim 2, wherein the primary coil and the secondary coil are placed concentrically relative to one another.

4. The connector as claimed in claim 3, wherein the secondary coil is resting against a collar of the board.

5. The connector as claimed in claim 4, wherein the board is secured to a stem forming a core, the primary and secondary coils being held together by a washer that is bolted onto the stem of the core and forming the removable attachment means.

6. The connector as claimed in claim 2, wherein the primary coil and the secondary coil are coaxial and superposed.

7. The connector as claimed in claim 6, wherein the board is secured to a core whereof an extension forms a centering spindle for the secondary coil.

8. The connector as claimed in claim 7, wherein the secondary coil is retained by bolting forming the removable attachment means.

9. The connector as claimed in claim 1, wherein the primary coil and the secondary coil are placed concentrically relative to one another.

10. The connector as claimed in claim 1, wherein the primary coil and the secondary coil are coaxial and superposed.

11. An induction sensor comprising means for connection to a signal-transmission wiring formed of a connector as claimed in claim 1.

12. An assembly comprising at least two induction sensors as claimed in claim 11, the electrical connectors being concentric and stacked on one and a same spindle.

13. A device for measuring an operating parameter of an engine, or measuring rotation speed, comprising:

at least two induction sensors connected to an electrical harness by electrical connectors as claimed in claim 1.

* * * * *